United States Patent [19]
Suzuki et al.

[11] Patent Number: 5,371,940
[45] Date of Patent: Dec. 13, 1994

[54] PALLET ARRANGING SYSTEM

[75] Inventors: Shozo Suzuki; Satomi Furukawa; Katsuji Kobayashi; Yutaka Wakizaka, all of Kawasaki, Japan

[73] Assignee: Fujitsu Limited, Kawasaki, Japan

[21] Appl. No.: 886,646

[22] Filed: May 20, 1992

[30] Foreign Application Priority Data

May 24, 1991 [JP] Japan .................................. 3-148175
May 24, 1991 [JP] Japan .................................. 3-148178

[51] Int. Cl.$^5$ .................................................. B23P 21/00
[52] U.S. Cl. .......................................... 29/703; 29/739; 29/784
[58] Field of Search ............... 29/703, 729, 739, 740, 29/741, 784, 799; 198/339.1, 341; 364/474; 414/222, 273, 279, 788

[56] References Cited

U.S. PATENT DOCUMENTS

| | | | |
|---|---|---|---|
| 2,896,314 | 7/1959 | Godwin et al. | 29/784 X |
| 4,369,563 | 1/1983 | Williamson | 414/279 X |
| 4,476,627 | 10/1984 | Matsuura et al. | 29/703 X |
| 4,719,694 | 1/1988 | Herberich et al. | 198/341 X |

FOREIGN PATENT DOCUMENTS

| | | |
|---|---|---|
| 62-290604 | 12/1987 | Japan . |
| 63-300844 | 12/1988 | Japan . |
| 1-183344 | 7/1989 | Japan . |
| 5633313 | 4/1992 | Japan . |
| 61123150 | 6/1992 | Japan . |

Primary Examiner—Peter Dungba Vo

[57] ABSTRACT

Disclosed is a pallet arranging system for use in a multiple-item small-lot production setup. The system uses a plurality of pallet groups each comprising a plurality of pallets, each of the pallets including a plurality of cartridges, each of the cartridges containing a large number of parts of the same type. The system creates channel setting data for use by a part assembler fed with parts and printed circuit boards. The parts are assembled by the part assembler onto predetermined positions on the printed circuit boards in accordance with the channel setting data that designate which cartridge is to be assigned to which of the channels constituting the pallet groups.

8 Claims, 20 Drawing Sheets

FIG. 8A

| x x x | Pesult of Pallet Arrangement | x x x |

| Product Type | Pallet 1 | Pallet 2 | Pallet 3 | ------ | Pallet 7 |
|---|---|---|---|---|---|
| Z1 | 20 | 20 | 10 | | 13 |
| Z2 | 15 | 15 | 10 | | 6 |
| Z3 | 30 | 30 | 12 | | 12 |

Time required per pallet

FIG. 8B

× × × Arrangement Order Sheet × × ×

(Group 1)

|      | Pallet 1 | Pallet 2 | Pallet 3 | ----- | Pallet 7 |
|------|----------|----------|----------|-------|----------|
| CH 1 | CT 2     | CT 11    | CT 54    |       | CT 9     |
| 2    | CT 12    | CT 63    | CT 10    |       | CT 5     |
| 3    | CT 3     | CT 1     | CT 33    |       | CT 75    |
| ⋮    |          |          |          |       |          |
| 30   | CT 86    |          |          |       |          |

Cartridge ID

FIG. 9

| No. of channels / No. of Parts | 1<br>1~60 | 2<br>61~90 | 3<br>91~120 | 4<br>121~150 | 5<br>151~180 | 6<br>181~210 |
|---|---|---|---|---|---|---|
| 1  1~60     | 2~2 | —   | —   | —   | —   | —   |
| 2  61~80    | 2~3 | 3~3 | —   | —   | —   | —   |
| 3  81~100   | 2~4 | 3~4 | 4~4 | —   | —   | —   |
| 4  101~120  | 2~5 | 3~5 | 4~5 | 5~5 | —   | —   |
| 5  121~140  | 2~6 | 3~6 | 4~6 | 5~6 | 6~6 | —   |
| 6  141~160  | 2~7 | 3~7 | 4~7 | 5~7 | 6~7 | 7~7 | x →, y →

FIG. 10

PALLET ARRANGING SYSTEM

BACKGROUND OF THE INVENTION

1. Field of the Invention

The present invention relates to a pallet arranging system for use with a part assembler supplied with pallets and printed circuit boards, each pallet having cartridges each containing parts to be mounted onto the printed circuit boards by the assembler. More particularly, the invention relates to a pallet arranging system that creates channel setting data for designating which cartridge is to be assigned to which channel of a pallet group comprising a plurality of pallets.

2. Description of the Related Art

Recent years have seen electronic apparatuses shrinking in size and loosing more weight even as their functionality is increasingly diversified. The trend has required that printed circuit board units making up such apparatuses be enhanced in packaging density. With smaller and more complex parts to be mounted in greater numbers, the part assembling work hitherto done by manual labor with growing difficulty is currently being taken over by increasing numbers of automated part assemblers. These machines are expensive, and labor costs are also rising at the factories. Thus there is recognized an acute need to run the equipment unattended as much as possible for higher efficiency.

There exist part assemblers fed with pallets and printed circuit boards, each pallet having cartridges each containing parts to be mounted by the machines where designated onto the printed circuit boards. Part assemblers of this type retrieve parts one by one from each cartridge in the pallet, and assemble these parts in a predetermined order onto the printed circuit boards. Where a part assembler is to be run unattended, it is necessary to prepare beforehand the channel setting data for designating which cartridge is to be assigned to which channel of the pallet group as well as the numerical control data for specifying printed circuit board positions into which to assemble the parts.

In a multiple-item small-lot production setup, the same production line may have to deal with different types of products. In that case, the machines on the production line need to have their production settings re-established or modified every time a different product is to be handled. That is, preparatory steps such as machine readjustments and changing of materials are called for. Take the above-mentioned part assemblers for example. These machines require carrying out many steps to change the pallets involved between production runs. In this respect, those printed circuit boards that are handled collectively by the same process should preferably be arranged into a single group. But there are yet to be proposed pallet arranging systems that take this point into consideration.

SUMMARY OF THE INVENTION

It is therefore an object of the present invention to provide a pallet arranging system that allows those parts common to certain printed circuit boards to be assembled thereonto by part assembler in a chronologically random order, whereby the number of preparatory steps between production runs is minimized for a substantial increase in the operating ratio of the part assembler in a multiple-item small-lot production setup.

In carrying out the invention and according to one aspect thereof, there is provided a pallet arranging system using a plurality of pallet groups each comprising a plurality of pallets, each of the pallets including a plurality of cartridges, each of the cartridges containing a large number of parts of the same type, the pallet arranging system creating channel setting data for use by a part assembler, the part assembler being fed with parts and printed circuit boards, the parts being assembled by the part assembler onto predetermined positions on the printed circuit boards, the channel setting data designating which cartridge is to be assigned to which of the channels constituting each pallet group, the pallet arranging system comprising: a production order table for storing production order information about the types of the printed circuit boards; part assembly table for storing part assembly information about each of the printed circuit boards; grouping means for obtaining the types of the parts to be assembled onto each of the printed circuit boards, the obtaining of the part types being performed based on the production order information and on the part assembly information, the grouping means further grouping the printed circuit boards into groups of boards, each of the board groups comprising the printed circuit boards onto which parts are assembled from the same pallet group, the grouping of the printed circuit boards being performed so as to minimize the number of times the pallet groups are changed on the part assembler in consideration of the types of the parts and of a maximum allowable number of the channels; and channel setting data creating means for creating the channel setting data regarding the pallet groups affected by the grouping.

The above and other objects, features and advantages of the present invention and the manner of realizing them will become more apparent, and the invention itself will best be understood, from a study of the following description and appended claims with reference to the attached drawings showing some preferred embodiments of the invention.

BRIEF DESCRIPTION OF THE DRAWINGS

FIG. 8A is a view of a typical display screen that appears in step 224 of FIG. 7C;

FIG. 8B is a view of a typical display screen that appears in step 225 of FIG. 7C;

FIG. 9 is a view of a typical matrix created in step 206 of FIG. 7A;

FIG. 10 is a view showing how product types are "included" from one group to another on the matrix of FIG. 9 in connection with the embodiment;

DESCRIPTION OF THE PREFERRED EMBODIMENTS

Figure 1:
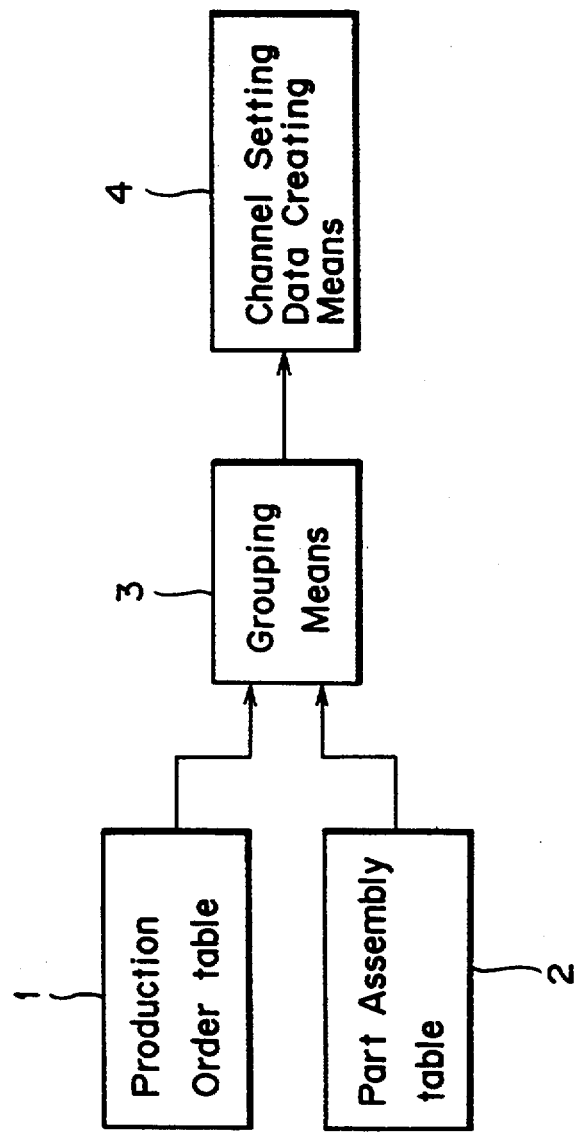
FIG. 1 is a block diagram of a pallet arranging system embodying the present invention.

A preferred embodiment of the invention will now be described with reference to the accompanying drawings in which like reference numerals designate like or corresponding parts.

FIG. 1 is a block diagram showing the basic construction of a pallet arranging system embodying the invention. This system uses a plurality of pallet groups each comprising a plurality of pallets, each of the pallets including a plurality of cartridges, each of the cartridges containing a large number of parts of the same type. The pallet arranging system creates channel setting data for use by a part assembler, the data designating which cartridge is to be assigned to which of the channels constituting each pallet group. The part assembler, fed with parts and printed circuit boards, assembles the parts into predetermined positions on the printed circuit boards.

A first table (a production order table) 1 stores production order information about the types of the printed circuit boards. A second table (a part assembly table) 2 stores part assembly information about each of the printed circuit boards, the information being derived from the production order information. Grouping means 3 obtains the types of the parts to be assembled onto each of the printed circuit boards. The part types are obtained based on the production order information and on the part assembly information. The grouping means 3 further groups the printed circuit boards into groups of boards, each of the board groups comprising the printed circuit boards onto which parts are to be assembled from the same pallet group. The printed circuit boards are grouped so as to minimize the number of times the pallet groups are changed on the part assembler in consideration of the types of the parts and of a maximum allowable number of the channels. Channel setting data creating means 4 creates the channel setting data regarding the pallet groups affected by the grouping.

Channel setting data are created as follows: The types of the parts to be assembled onto each of the target printed circuit boards are obtained from the production order information in the first table 1 and from the part assembly information in the second table 2. The grouping means 3 groups the printed circuit boards in a way that minimizes the number of times the pallet groups are changed on the part assembler given the entire parts and the maximum allowable number of the channels to be set. That is, the printed circuit boards are grouped so as to minimize the pallet changing steps during the assembly process. The grouping is such that the same group of printed circuit boards receives parts for assembly thereto from the same pallet group. The channel setting data creating means 4 then creates channel setting data about the pallet groups affected by the grouping.

One pallet group is illustratively made of seven pallets. Each pallet is illustratively assigned up to 30 cartridge mounting channels. In this case, the maximum allowable number of channels for the whole pallet group is 210. The reason the invention utilizes pallet groups each comprising a plurality of pallets is that parts are fed from the multiple pallets to the part assembler more quickly than if the entire 210 channels were set to a single pallet.

Figure 2:
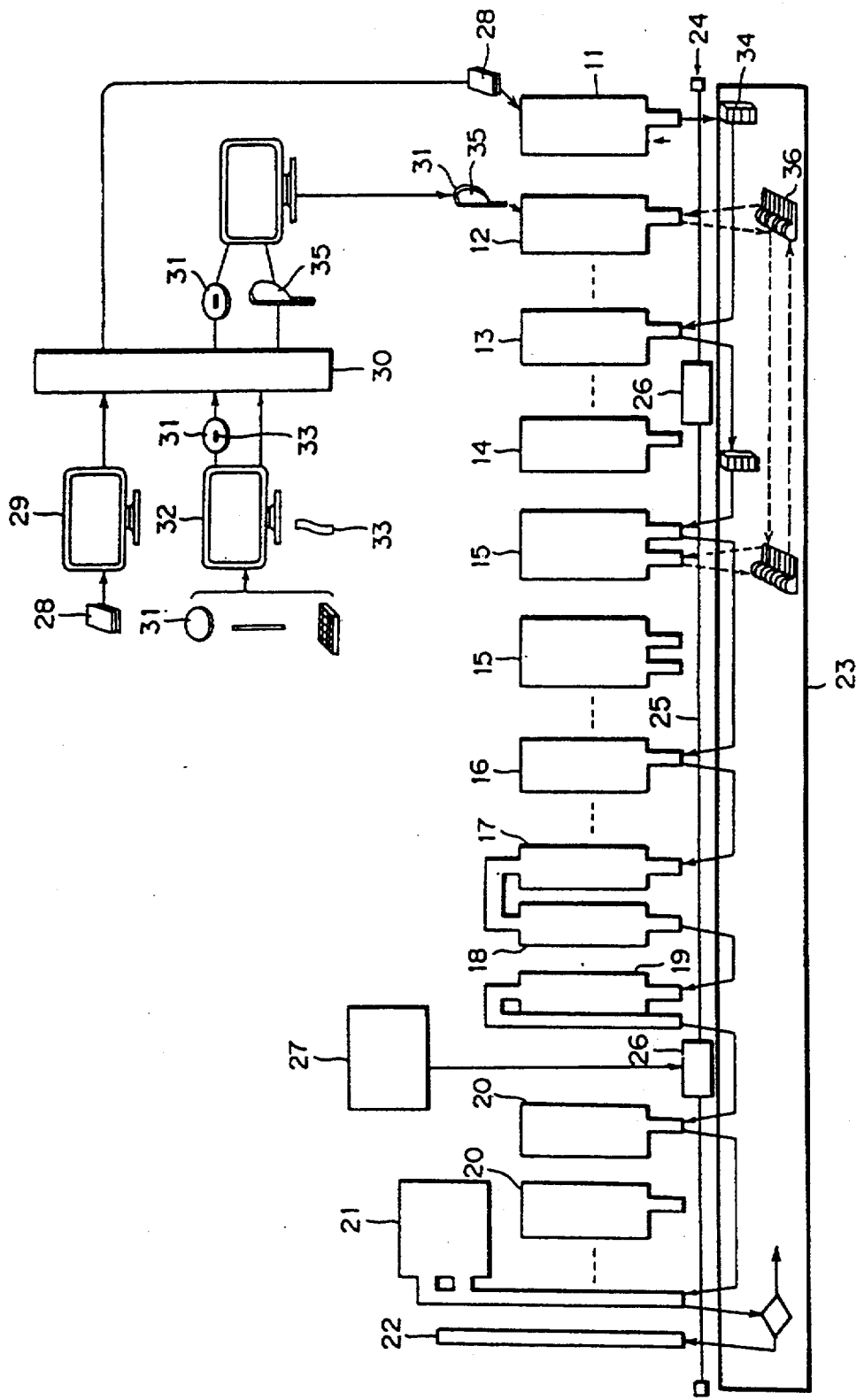
FIG. 2 is a view describing a typical production line to which the embodiment may be applied.

FIG. 2 is a view describing a typical production for use with the embodiment, the production line manufacturing printed circuit board units. Numerals 11 through 22 are cells, or machines that constitute the production line. Each of the cells functions as follows.

An ID furnishing machine 11, located at the head of the production line, attaches ID labels to printed circuit boards 28 being supplied thereto. The printed circuit boards 28 are grouped by type and accommodated into racks 34 accordingly. An automatic arranging machine 12 arranges cartridges it receives into a predetermined order and sets them onto a pallet 36 for output therefrom. A solder printing machine 13 applies solder cream through screen printing onto predetermined positions on the conductor pattern of the printed circuit boards. If parts are to be mounted onto the back side of printed circuit boards as well, an adhesive applicator machine 14 applies adhesive to that side for temporary fixture of the parts. This adhesive applicator machine 14 is not used where only one side (i.e., surface side) of printed circuit boards receive parts for assembly thereon.

A small part assembler 15 and a shaped part assembler 16 automatically assemble small parts and shaped parts onto printed circuit boards, respectively. Small parts such as chip resistors are supplied in a band-shaped part case wound onto a reel, the case accommodating a large number of parts (e.g., 1000 to 2000 parts) of the same kind distanced at equal intervals along the band. A reel 31 holding the numerous small parts thereon is mounted on each cartridge 35. The cartridges 35 are accommodated in the pallet 36 as mentioned for transfer to the part assembler. A reflow oven 17 performs fellow soldering onto the printed circuit boards on which parts are assembled. A total washing machine 18 washes the printed circuit boards having undergone reflow soldering. A curing oven 19 cures the adhesive applied onto the printed circuit boards by the adhesive applicator machine 14. A visual inspection machine 20 inspects the appearance of soldered printed circuit boards optically or using X-rays. A manual correction machine 21 places each printed circuit board in position for operators to correct manually the flaws or irregularities thereof detected by the visual inspection machine 20. Thereafter, the manual correction machine 21 ejects the printed circuit boards from their position of correction. Where only one side of printed circuit boards is to be mounted with parts, the boards from the manual correction machine 21 are sent to an ejection station 22. Where both sides of printed circuit boards are to be set with parts, the boards from the manual correction machine 21 are returned to the solder printing machine 13. The ejection station 22, the last machine on the production line, ejects the finished printed circuit board units after inspection and correction using a conveyor belt or the like. A rack/pallet storage 23 temporarily accommodates racks and pallets. A transport machine 24 transports racks and pallets among the cells 11 through 22 or between the cells and the storage 23. The transport machine 24 comprises a rail 25 laid out between each cell and the storage 23, at least one self-propelled vehicle 26 that runs on the rail 25 carrying racks or pallets, and a transport control system 27 that controls the operation of the self-propelled vehicle 26.

On their arrival at the factory, the printed circuit boards 28 have their data input to a board arrival control computer 29. The printed circuit boards 28 are then stored on component storage shelves 30. Parts 31 (or assemblies thereof) have their data upon arrival input to a part arrival control computer 32. ID labels 33 are attached to the parts 31 before the latter are stored on the component storage shelves 30. After leaving the ID furnishing machine 11 on the production line, the printed circuit boards 28 in the rack 34 are transported by the self-propelled vehicle 26 between the storage 23 and the cells excluding the automatic arranging machine 12. The reels 31 held in their cartridges 35 are supplied to the automatic arranging machine 12. The cartridges 31 are arranged into a predetermined order before being placed onto the production line. The pallet 36 containing the cartridges 35 is transported by the self-propelled vehicle 26 from the automatic arranging machine 12 through the small part assembler 15 to the storage 23.

The invention may be applied to the above-described production line where the automatic arranging machine 12 mounts cartridges onto pallets for delivery to the small part assembler 15.

Figure 3:
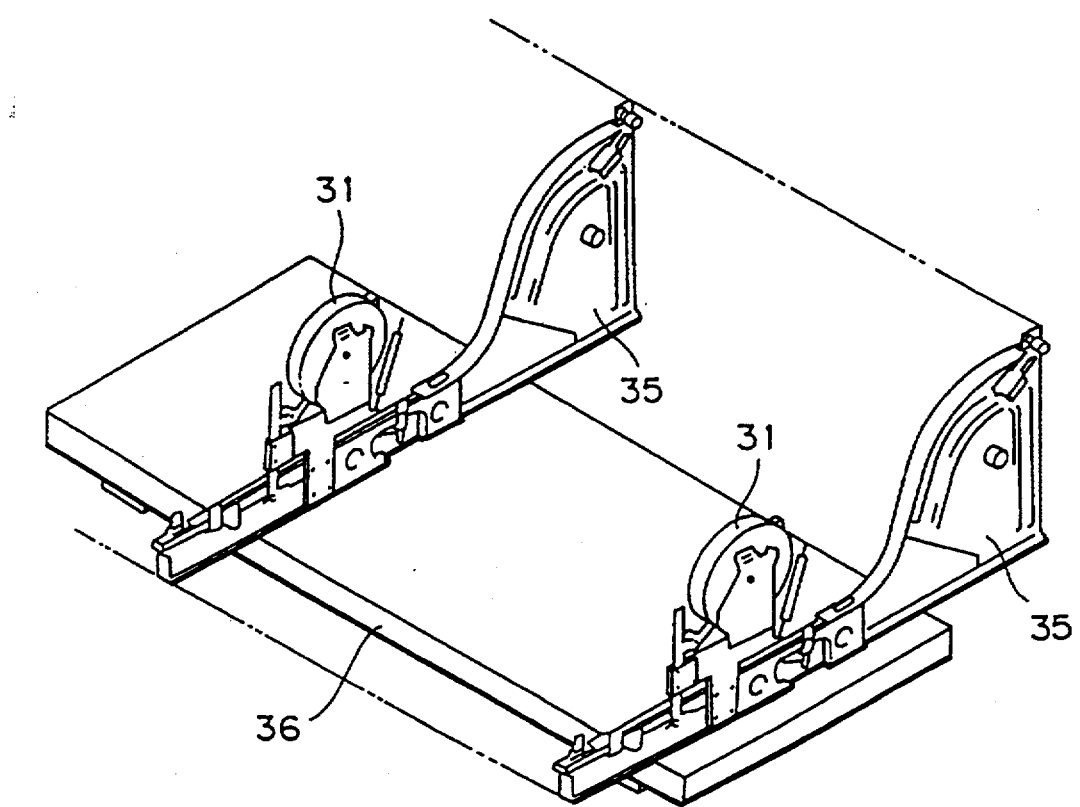
FIG. 3 is a perspective view showing how cartridges are illustratively mounted on a pallet in connection with the embodiment.

FIG. 3 is a perspective view showing how cartridges are illustratively mounted on a pallet in the setup where the invention is applied. Each reel 31 has a band-shaped part case wound around it, the case holding numerous parts (e.g., 1000 to 2000 chip parts, etc.) of the same type distanced at equal intervals along the band. Each reel 31 is set on a cartridge 35 from which the band-shaped part case is paid out. Cartridges 35 are suitably ordered and assigned to the channels on the pallet 36. In this embodiment, one pallet has 30 channels. If one cartridge 35 is wide enough to occupy a single channel, one pallet accommodates up to 30 cartridges. If one cartridge 35 occupies two channels, the maximum allowable number of cartridges per pallet is halved. One characteristic of this embodiment is to feed a plurality of (e.g., seven) pallets mounted with cartridges at a time to the small part assembler 15. This increases the apparent number of channels available for the assembler.

Figure 4:
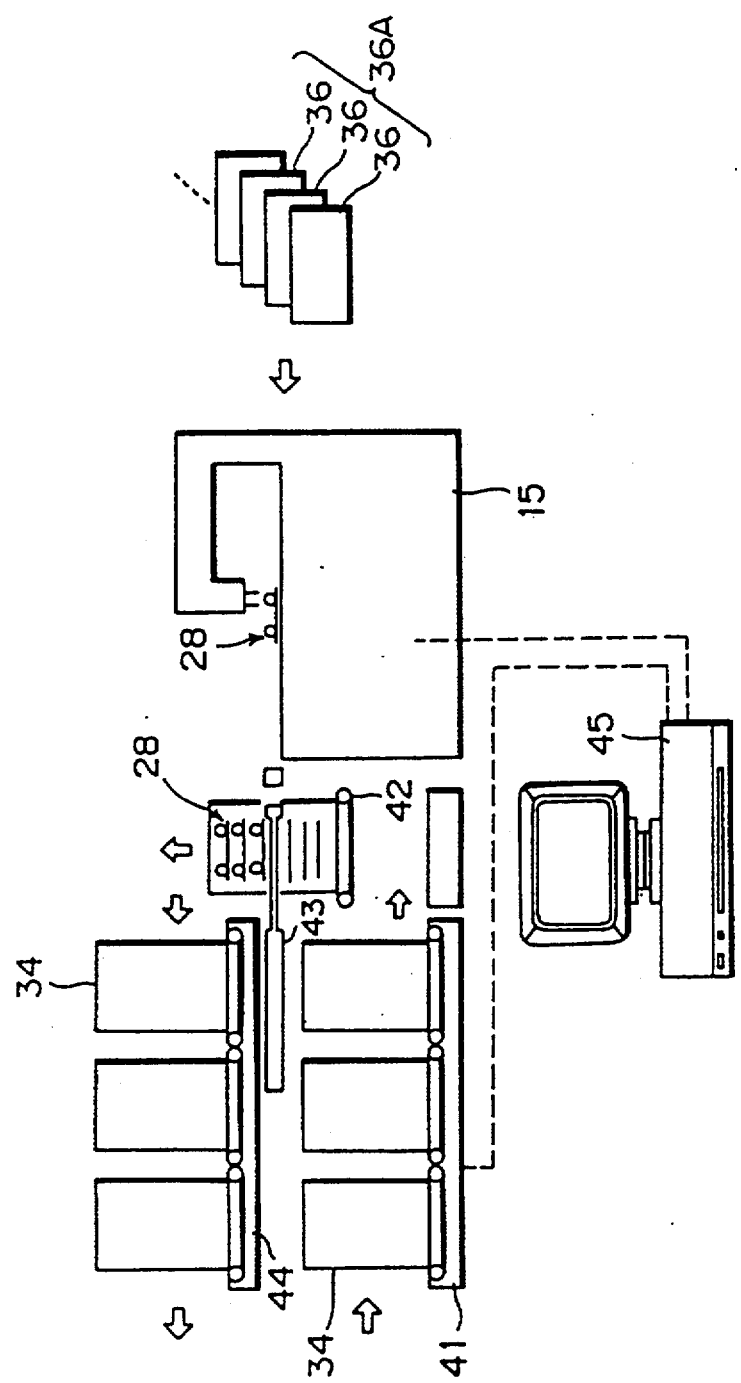
FIG. 4 is a view depicting how a part assembler typically functions in connection with the embodiment.

How the small part assembler 15 typically functions will now be described with reference to FIG. 4. The self-propelled vehicle 26 delivers a rack 34 to the small part assembler 15. The rack 34 is then carried by a conveyor belt 41 onto a lifter 42. A pusher 43 pushes the required print circuit board 28 up to the small part assembler 15. Meanwhile, the pallets 36 mounted with cartridges are fed at least two at a time to the small part assembler 15. The plurality of pallets 36 fed to the small part assembler 15 for each pass of assembly operation are called a pallet group 36A. The small part assembler 15 takes small parts from the pallet group 36A and assembles them to necessary positions on the printed circuit board 28. With the parts assembled thereto, the printed circuit board 28 is returned to the rack 34 and carried by an ejection conveyor belt 44 to the self-propelled vehicle 26. The above series of operations is supervised by a cell controller 45. The cell controller 45 outputs carrying-in and carrying-out request signals that control the transport of the racks and pallets.

Figure 5:
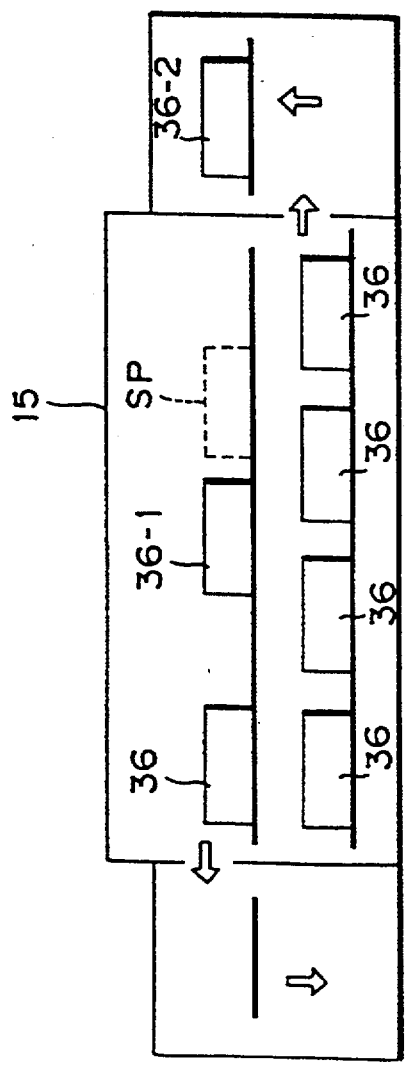
FIG. 5 is a view indicating how pallets are circulated with respect to the part assembler.

FIG. 5 shows how pallets are circulated relative to the small part assembler 15. While the pallet groups are being circulated, the small part assembler 15 takes necessary parts from each pallet that comes into a part collecting position. In the setup of FIG. 5, a pallet 36-1 is in the part collecting position. A pallet 36-2 is the next pallet to come into the part collecting position following the pallet 36-1. Reference characters SP stand for a stand-by position from which a pallet may move immediately into the part collecting position. With the small part assembler 15 thus constructed, the mechanical constraints thereof require that the pallets move not in synchronization but in a slightly asynchronous manner. That is, there occurs a time lag between the time the pallet 36-1 is set in the part collecting position and the time the next pallet 36-2 is set to the stand-by position SP. Thus if necessary parts are collected from the pallet 36-1 before the next pallet 36-2 is set to the stand-by position SP, a loss of time will result.

Suppose that some pallets (relevant pallets) contain the parts to be assembled to a printed circuit board while other pallets (irrelevant pallets) have no such parts for that board. In that case, the irrelevant pallets circulate only to yield time losses for that particular printed circuit board. On the other hand, each relevant pallet circulation entails no time loss if the time required for part collection therefrom is longer than the time between setting of the pallet to the part collecting position on the one hand, and setting of the next pallet to the standby position on the other. This requires a special consideration in creating channel setting data designating which cartridge is to be assigned to which channel of the pallet group. That consideration involves letting the relevant pallets consume as equal times as possible in the assembly of parts to the target printed circuit board. The pallets arranged in this manner minimize time losses.

Figure 6:
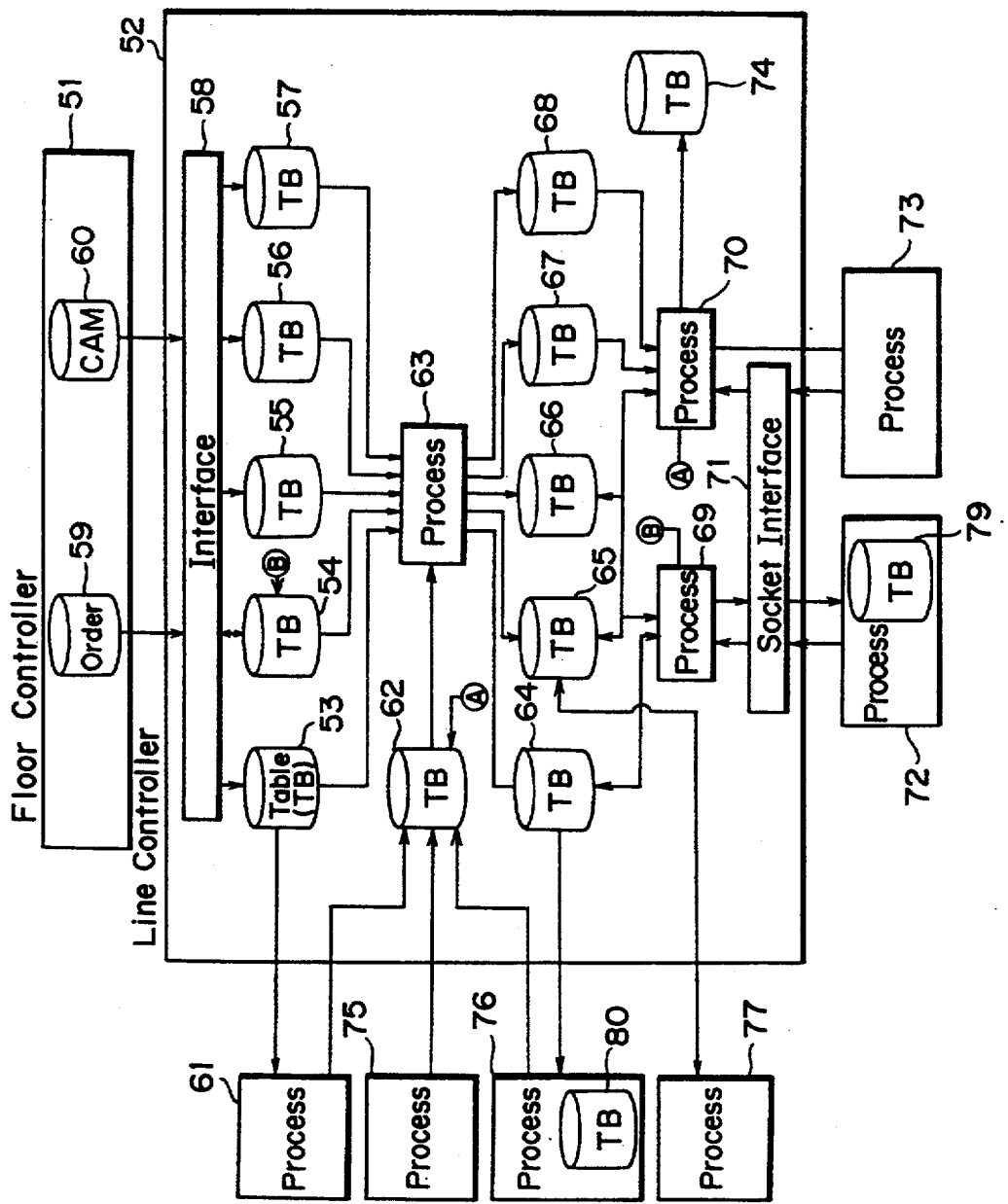
FIG. 6 is a view illustrating a typical database associated with the embodiment.

FIG. 6 illustrates a typical database associated with the pallet arranging system embodying the invention. In FIG. 6, a floor controller 51 controls the entire floor on which the production line of FIG. 2 is established. A line controller 52 controls the production line of FIG. 2. Information from an order file 59 and from CAM data file 60 in the floor controller 51 is sent via an interface 58 to the line controller 52. After an appropriate data conversion process, the processed information is stored into a part specification table 53, an order control table 54, a product type table 55, a source data table 56 and a part data table 57. A process 61 controls a label issuing machine based on the ID codes retrieved from the table 53. The data about reel identification from the process 61 is placed into a table 62. A process 63 performs pallet arrangement and related operations in accordance with the data from the tables 53, 54, 55, 56, 57 and 62. The information about the result of pallet arrangement is placed in a pallet control table 64, a rack control table 65, a group control table 66, an NC table 67 and an NC data table 68. A process 69 controls the transport of the racks and pallets based on the result of pallet arrangement and related data. A process 70 controls the cells such as the part assembler also in accordance with the result of pallet arrangement and related data. Processes 69 and 70 are connected direct or via a socket interface 71 to processes 72 and 73, respectively. The process 72 addresses transport control, and the process 73 handles cell control. A table 74 stores operation result data coming from the process 70. The information about the actual number of parts used by the part assembler is sent from the process 70 to the table 62. The information in the table 62 is used for control over the remaining number of parts held by each reel. A process 75 transmits the data about cartridge identification to the table 62. A process 76, connected to the tables 62 and 64, controls the automatic arranging machine 12. A process 77 is connected to the table 65 and provides control over the ID furnishing machine 11. The process 72 has a storage control table 79, while the process 76 has an address control table 80. The table 54 is updated by use of the data about the progress in the process 69. The order file 59 is also updated along with the table 54.

The major functions of the process 63 addressing pallet arrangement are as follows:

(1) Work order extracting function

This function involves automatically extracting from various work orders those that permit pallet arrangement. The function also allows operators to select manually from the diverse work orders those associated with pallet arrangement.

(2) Grouping function

This function involves grouping the product types of printed circuit boards in such a manner that the number of times the part-bearing pallet groups are changed on the part assembler will be minimized. In this case, with the time loss taken into account for each pallet moving into the stand-by position, a decision is made beforehand as to whether or not the grouping of the product types is appropriate.

(3) Channel setting data creating function

This function involves determining which cartridge is to be assigned to which channel of each pallet group. To create the channel setting data requires letting each of the pallets making up the pallet group consume as equal times as possible relative to the target printed circuit board. If there are a plurality of cartridges all containing reels of the same type, the cartridge having the fewest parts takes precedence during assembly, followed by those with progressively larger numbers of parts. Likewise, the cartridge containing the shortest parts takes precedence during assembly, followed by those cartridges with progressively taller parts. The channel setting data thus created are output in one of two ways: to be issued as assembly order sheets on a monitor screen and/or in document, or to be transmitted direct to the automatic arranging machine 12. In the former case, cartridges are mounted manually on pallets; in the latter case, cartridges are mounted automatically on pallets by the automatic arranging machine 12.

Figure 7A:
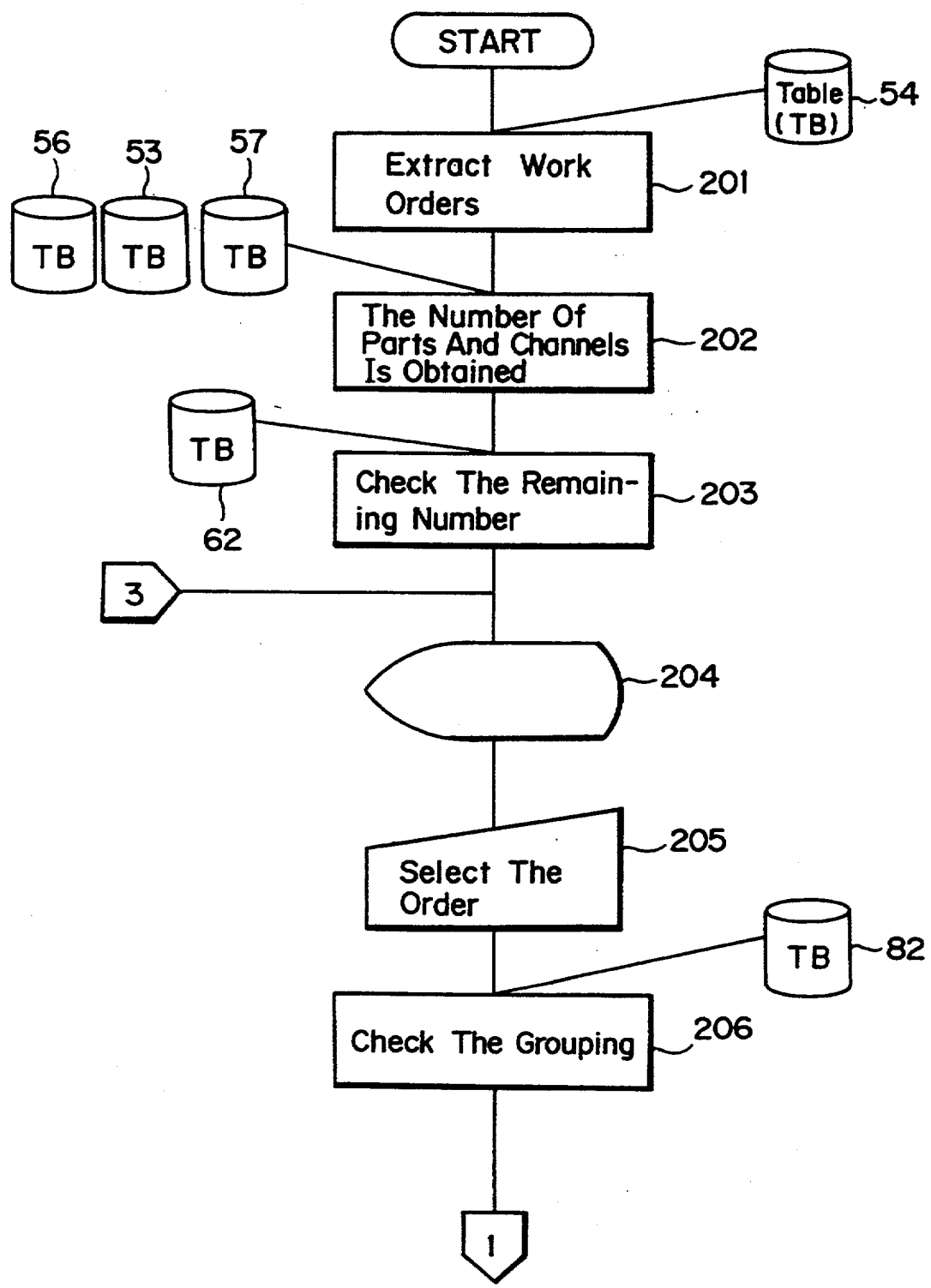
FIG. 7A is a flowchart of the steps in the first of three parts constituting a pallet arranging process performed by the embodiment.
Figure 7B:
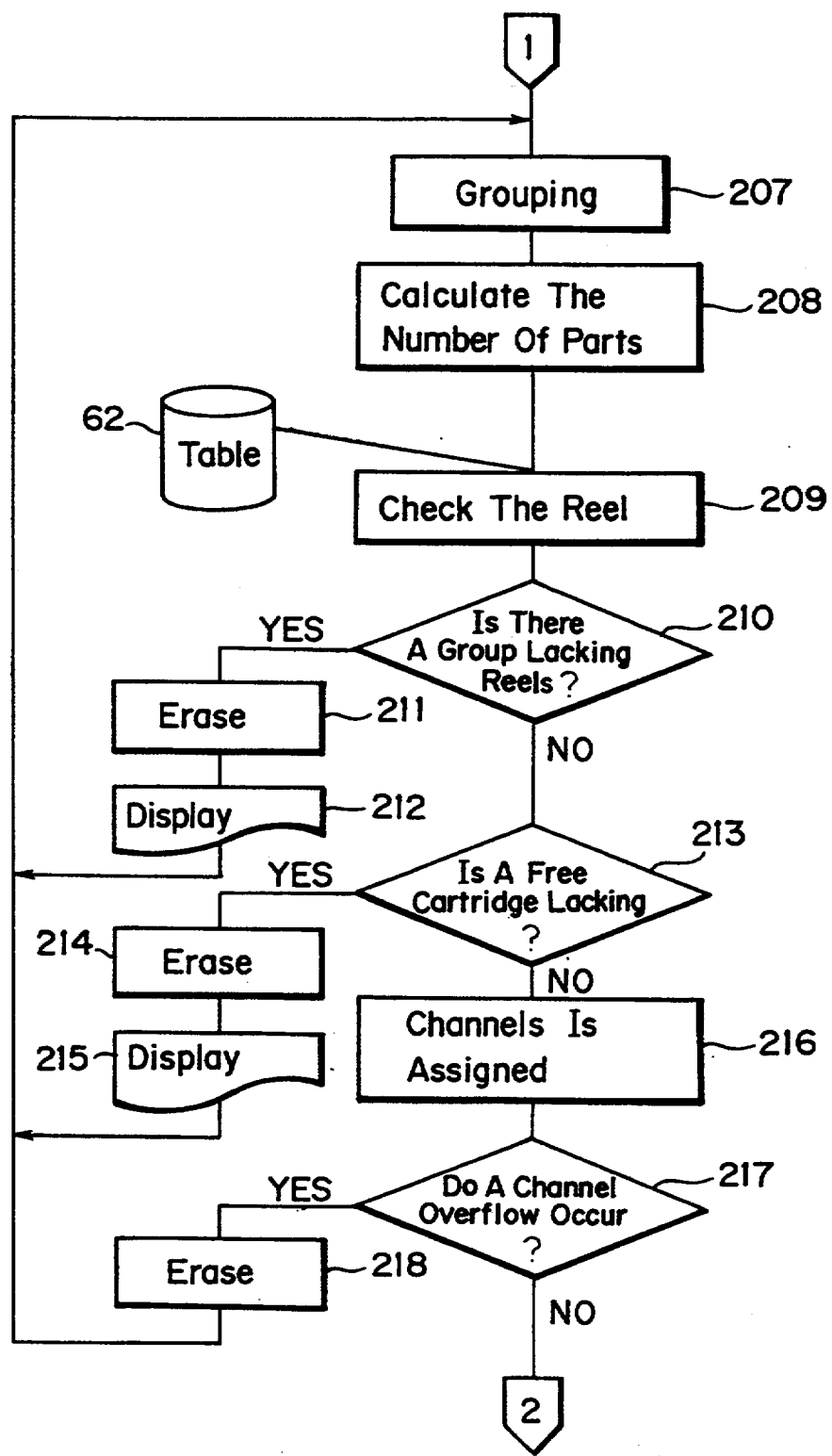
FIG. 7B is a flowchart of the steps in the second of the three parts constituting the pallet arranging process performed by the embodiment.
Figure 7C:
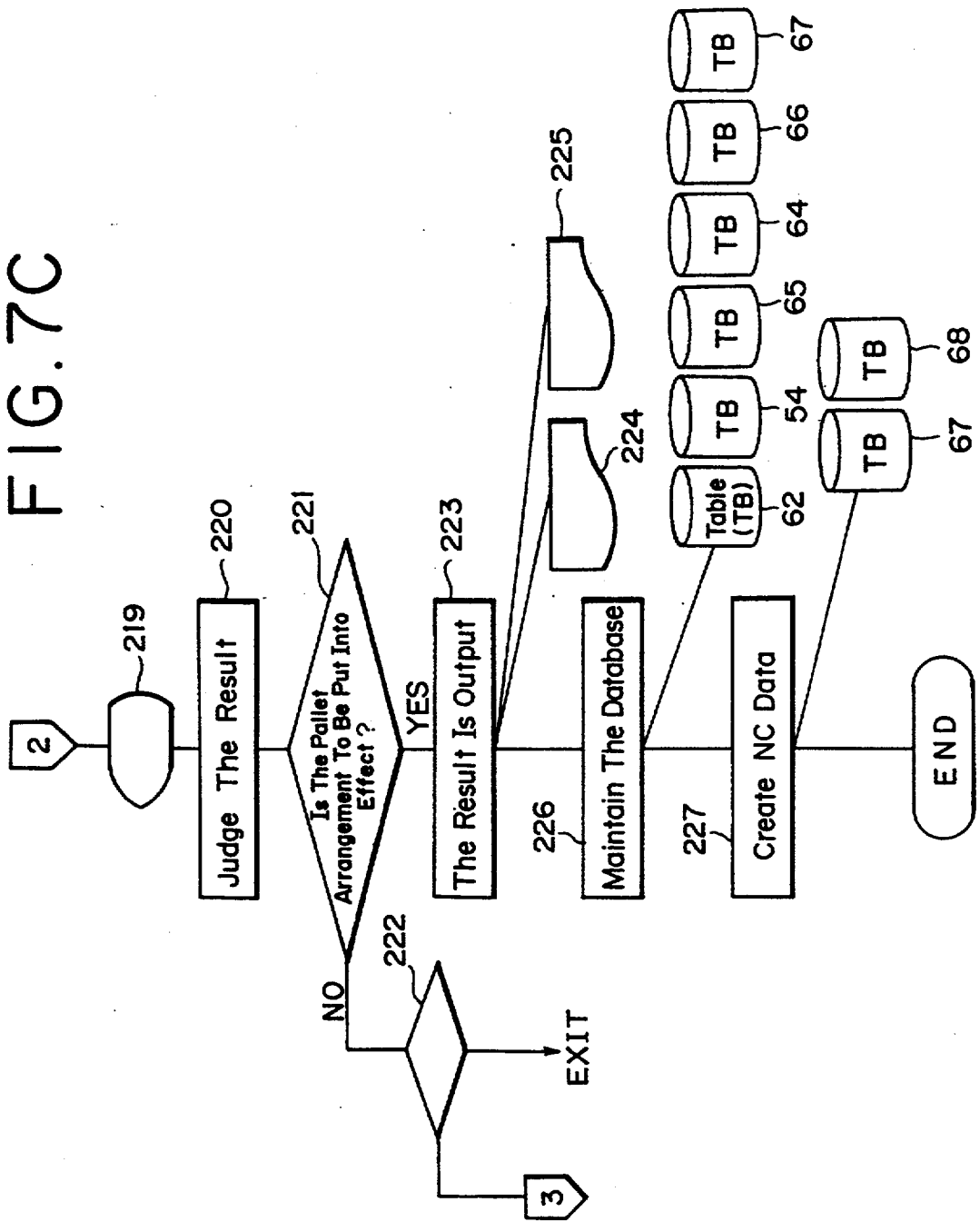
FIG. 7C is a flowchart of the steps in the third of the three parts constituting the pallet arranging process performed by the embodiment.

Below is a description of how the process 63 carries out pallet arrangement with reference to the flowcharts of FIGS. 7A through 7C. FIG. 7A is a flowchart of the steps making up the first of three parts that constitute the process 63. FIG. 7B is a flowchart of the steps forming the second of the three parts that compose the process 63. FIG. 7C is a flowchart of the steps making up the third of the three parts constituting the process 63.

In step 201 of FIG. 7A, the order control table 54 is referenced so that all work orders applicable to pallet arrangement are extracted therefrom. In step 202, the source data table 56, part specification table 53 and part data table 57 are referenced so that the number and the type of parts to be used and the number of the channels involved are obtained for each product type. In step 203, the reel control table 62 and other applicable tables are referenced to check the remaining number of parts and that of printed circuit boards, followed by the decision of the work order in accordance with the schedule by which the products will be delivered to their customers. The work order thus determined is displayed on a monitor screen or the like in step 204. If the work order is to be determined manually, an operator checks the contents displayed in step 204 and selects the appropriate order in step 205. Step 206 checks to see if the contemplated grouping of the product types of the printed circuit boards involved is appropriate before that grouping is actually implemented. A table 82 referenced in step 206 contains a matrix having as its parameters the number of channels and that of parts per pallet group for a given printed circuit board. The decision about whether or not the grouping upon reference to the matrix is appropriate will be described later.

In step 207 of FIG. 7B, the target printed circuit boards are grouped if such grouping is deemed appropriate. How the grouping is specifically carried out will be discussed later. In step 208, the number of parts to be used per group is calculated. In step 209, the reel control table 62 is referenced to see if the reels containing necessary numbers of parts are mounted on cartridges. In step 210, a check is made to see if any group lacks a reel or reels. If any such group is found to exist, step 211 is reached. In step 211, the corresponding product type is erased. In step 212, the missing reel or reels are displayed, before step 207 is reached again for another attempt at grouping. If no group is found to lack any reels in step 210, step 213 is reached. In step 213, a check is made to see if a free cartridge is lacking. If a free cartridge is found to be lacking, step 214 is reached. In step 214, the applicable product type is erased. In step 215, the missing cartridge is displayed, followed by step 207 in which another attempt at grouping is carried out. If step 213 finds that no free cartridge is lacking, step 216 is reached in which channels are assigned to each group. That is, there are created channel setting data designating which cartridge is to be assigned to which channel of each pallet group.

Three considerations are required in creating the channel setting data. The first consideration involves letting each of the pallets making up the pallet group consume as equal times as possible relative to the target printed circuit board. The second consideration is that, if there are a plurality of cartridges all containing reels of the same type, the cartridge having the fewest parts is allowed to take precedence for assignment to the channels, followed by those cartridges with progressively larger numbers of parts. This prevents the occurrence of many reels with partially scattered parts left thereon. A more detailed discussion about this point will follow. The third consideration involves allowing the cartridge containing the shortest parts to take precedence during assembly, followed by those cartridges with progressively taller parts. The reason for this consideration is this: When parts are assembled onto printed circuit boards, the boards need to be moved at relatively high speeds. If taller parts are mounted earlier, the force of inertia produced by acceleration and deceleration of the fast-moving boards can cause the taller parts to fall.

In step 217, a check is made to see if a channel overflow occurs to any given pallet group. In case a channel overflow is deemed to occur, step 218 is reached. In step 218, the corresponding product type is erased from that pallet group, and step 207 is reached again for another attempt at grouping. If no channel overflow is expected, step 219 of FIG. 7C is reached.

In step 219, the result of the above-described pallet arrangement is displayed on the monitor screen or the like. Step 220 judges the result of the pallet arrangement. In step 221, a check is made to see if the pallet arrangement is to be put into effect. If it is determined in step 221 not to implement the pallet arrangement, step 222 is reached in which one of two decisions is made: either to stop the pallet arranging process and leave the current routine, or to return to step 204 for another selection of an order based on the order contents being displayed. If step 221 determines that the pallet arrangement is to be implemented, step 223 is reached in which the result of the pallet arrangement is output. In step 224, the result of the pallet arrangement is displayed. In step 225, an arrangement order sheet is issued. FIG. 8A shows typical contents of what is displayed in step 224, and FIG. 8B depicts typical contents of the arrangement order sheet issued in step 225. In step 226, the database is maintained in accordance with the output result of the pallet arrangement. The database affected in step 226 comprises the tables 54, 62, 64, 65, 66 and 67. Step 227 creates NC data for operating the small part assembler 15, and places the data in the tables 67 and 68. The NC data thus created are retrieved automatically by the cell controller 45 for transmission to the small part assembler 15 when a rack is fed to the cell. Necessary parts are then assembled automatically based on the NC data.

FIG. 9 shows a typical matrix created in step 206 of FIG. 7A, the matrix being used to determine in advance whether the contemplated grouping is appropriate or not. The matrix comprises as its parameters the number of channels and that of parts per pallet group for a given printed circuit board. The matrix also includes maximum and minimum pallet counts. A maximum pallet count is determined in such a way that eliminates time losses when the pallets in circulation move successively into the stand-by position of the small part assembler 15. A minimum pallet count is a count that ensures the number of channels corresponding to the number of parts to be assembled. For example, when the column number X is 3 and the row number Y is 5 in the matrix, the number of channels is from 91 to 120 and the number of parts from 121 to 140. Under these conditions, as shown in the matrix, the maximum pallet count is 6 and the minimum pallet count is 4. That is, at least four pallets are needed to ensure the number of channels corresponding to the parts to be assembled. Furthermore, eliminating time losses requires having six pallets or fewer. Where the column number X is 3 and the row number Y is 3 in the matrix, the number of channels is from 91 to 120, the number of parts is from 81 to 100, and the maximum and the minimum pallet count are both 4. Given such matrix elements, there is no degree of freedom in terms of pallet count.

In this matrix, the channels are grouped in multiples of 30 because the number of channels per pallet is 30. The reason the parts are grouped in multiples of 20 is this: On the part assembler for use with this embodiment, it takes eight seconds between the time a pallet is set to the part collecting position and the time the next pallet comes into the stand-by position. From the pallet in the part collecting position, it takes 0.4 seconds to collect a single part. If 20 or more parts are to be collected from the pallet by the part assembler, there occurs no time loss before the next pallet comes into the stand-by position.

In the description that follows, any matrix element that needs to be specified is specified by use of a GT code G(X, Y), the X coordinate standing for a column number and the Y coordinate for a row number. When the column number X increases, i.e., when the number of channels is raised, the minimum pallet count is also raised. When the row number Y increases, i.e., when the number of parts is raised, the maximum pallet count is raised accordingly. If the column number X is the same as the row number Y in the matrix, the maximum pallet count equals the minimum pallet count. Thus there is no degree of freedom in terms of pallet count. Suppose that prior to grouping, a check is made to see if two product types of printed circuit boards may belong to the same group. The above check is made on condition that the column number X and row number Y to which one of the product types corresponds are the same. In practice, the above check involves verifying if the corresponding product type may include the other product type.

Figure 10:
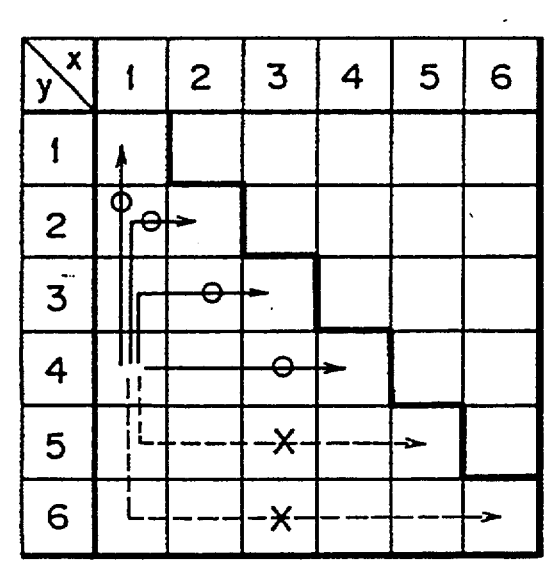

Specifically, where two product types apply to the same row number Y in the matrix, one product type corresponding to the smaller column number X may be included into the other product type corresponding to the larger column number X. Where two product types apply to the same column number X in the matrix, one product type corresponding to the larger row number Y may be included into the other product type corresponding to the smaller row number Y. More specifically, as shown in FIG. 10, the product type applicable to G(1, 4) may be included into any one of the product types corresponding to G(1, 1), G(2, 2), G(3, 3) and G(4, 4). That is, the product type that applies to G(1, 4) is not to be included into the same group as that comprising the product types corresponding to G(5, 5) or G(6, 6). Verifying if a given grouping is appropriate before actual execution thereof is very helpful in drastically reducing the number of possible combinations of product types to be grouped. Thus the amount of grouping calculations is minimized.

Figure 11:
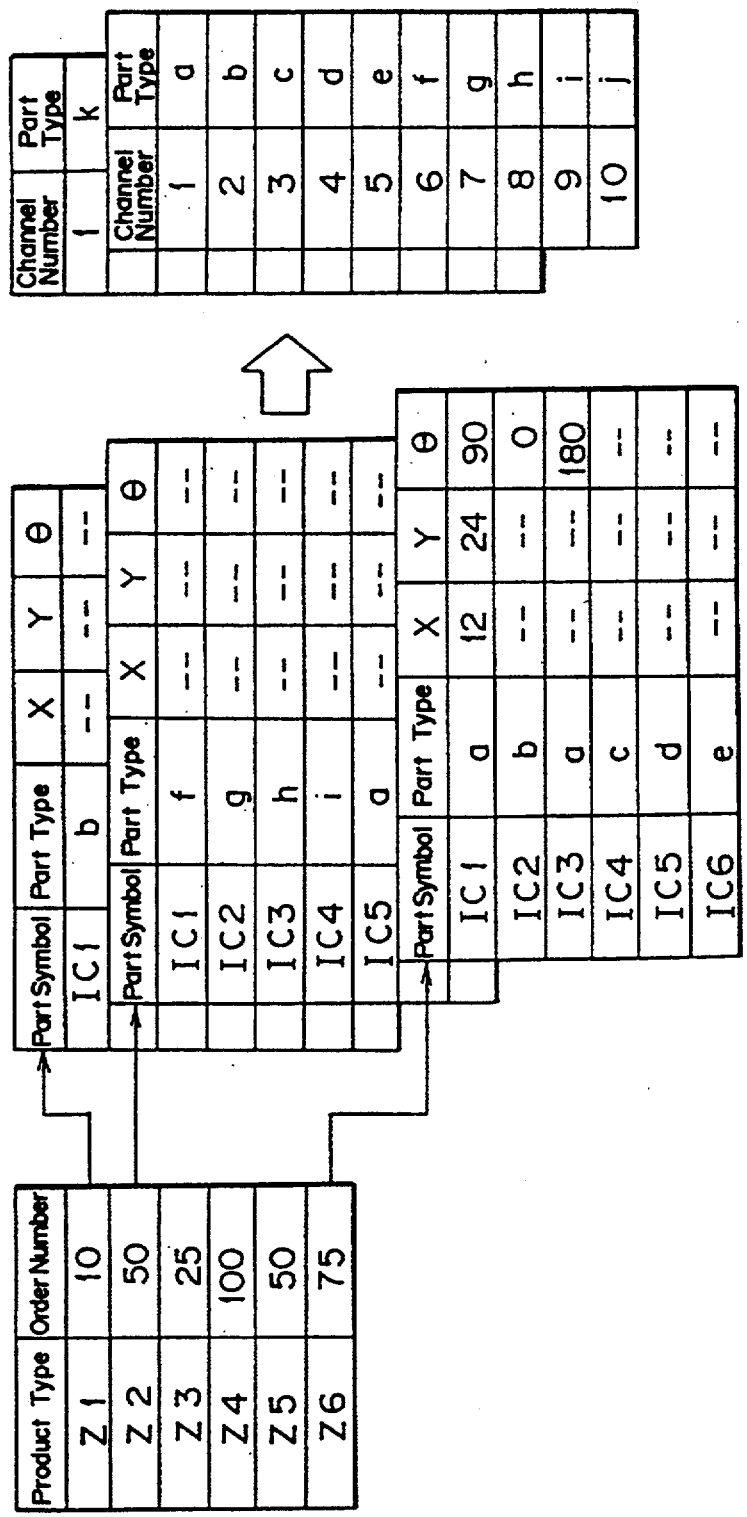
FIG. 11 is a conceptual view of how groups are created and channels are established in connection with the embodiment.

FIG. 11 is a conceptual view of how step 207 of 7B performs grouping and how step 216 sets channels. A table 93 (corresponding to the table 1 of FIG. 1) contains production order information about the product types of printed circuit boards. Specifically, the table 93 stores production order numbers based on the production order for each of the product types (Z1–Z6) of the printed circuit boards involved. A table 91 (corresponding to the table 2 of FIG. 1) stores part assembly information which derives from the production order information and which concerns each of the printed circuit boards. The part assembly information is made of the part symbols attached to the parts, assembly positions (X, Y) of the parts, assembly angles ($\theta$) of the parts, and part types (part names). Based on the production order information and on the part assembly information, the product types are grouped first. In accordance with the result of this grouping, channel setting data are created. The channel setting data thus created are placed in the table 92. The channel setting data are constituted by the part types (i.e., part names) for the cartridges to be assigned to their respective channels. The table 92 is prepared for each pallet group.

Figure 12:
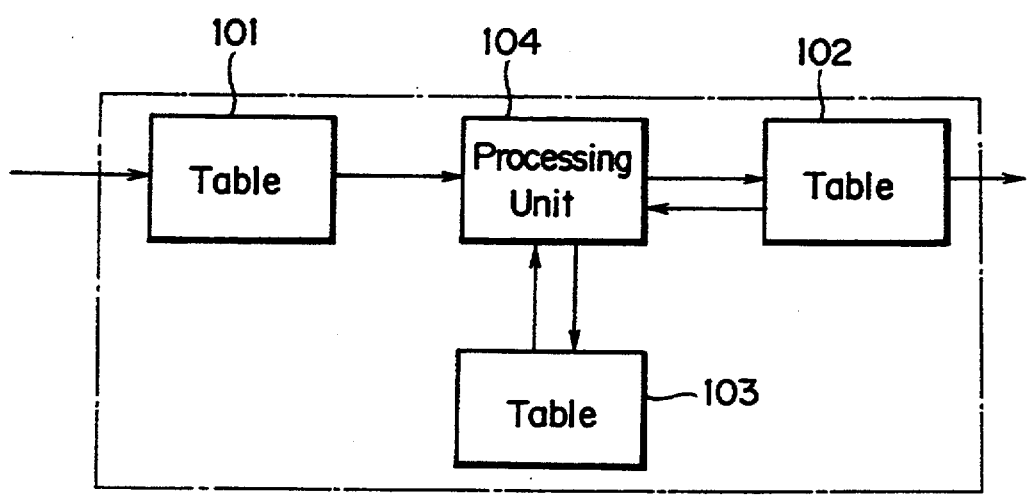
FIG. 12 is a block diagram of grouping means as it is illustratively implemented in the embodiment.

FIG. 12 is a block diagram of the grouping means of the embodiment as it is illustratively implemented. The grouping means comprises tables 101, 102 and 103 as well as a processing unit 104 that performs calculations for grouping. The table 101 stores all types of parts to be assembled to the printed circuit boards involved. The table 102 accommodates consecutively and individually items of information as they are received from the table 101. For each product type, the table 103 successively stores unmatched part counts, i.e., numbers of part types which are held in the table 101 but not found in the table 102.

The processing performed by the processing unit 104 includes the following two stages:

(a) In one stage, all printed circuit boards designated by production order information are matched with the table 91 (FIG. 11). From the table 91 containing the part assembly information, there is retrieved information about the part types for assembly to each printed circuit board. This part information is written to the table 101.

(b) In another stage, the table 101 is compared with the table 102 while the part information is being stored into the table 102. Unmatched part counts acquired from the comparison are written consecutively to the table 103. From the table 103 thus prepared, the product type with the fewest unmatched parts is selected every time a write operation is made to the table. The part information is written to the table 102 on condition that the maximum allowable channel count is not to be exceeded.

Figure 13:
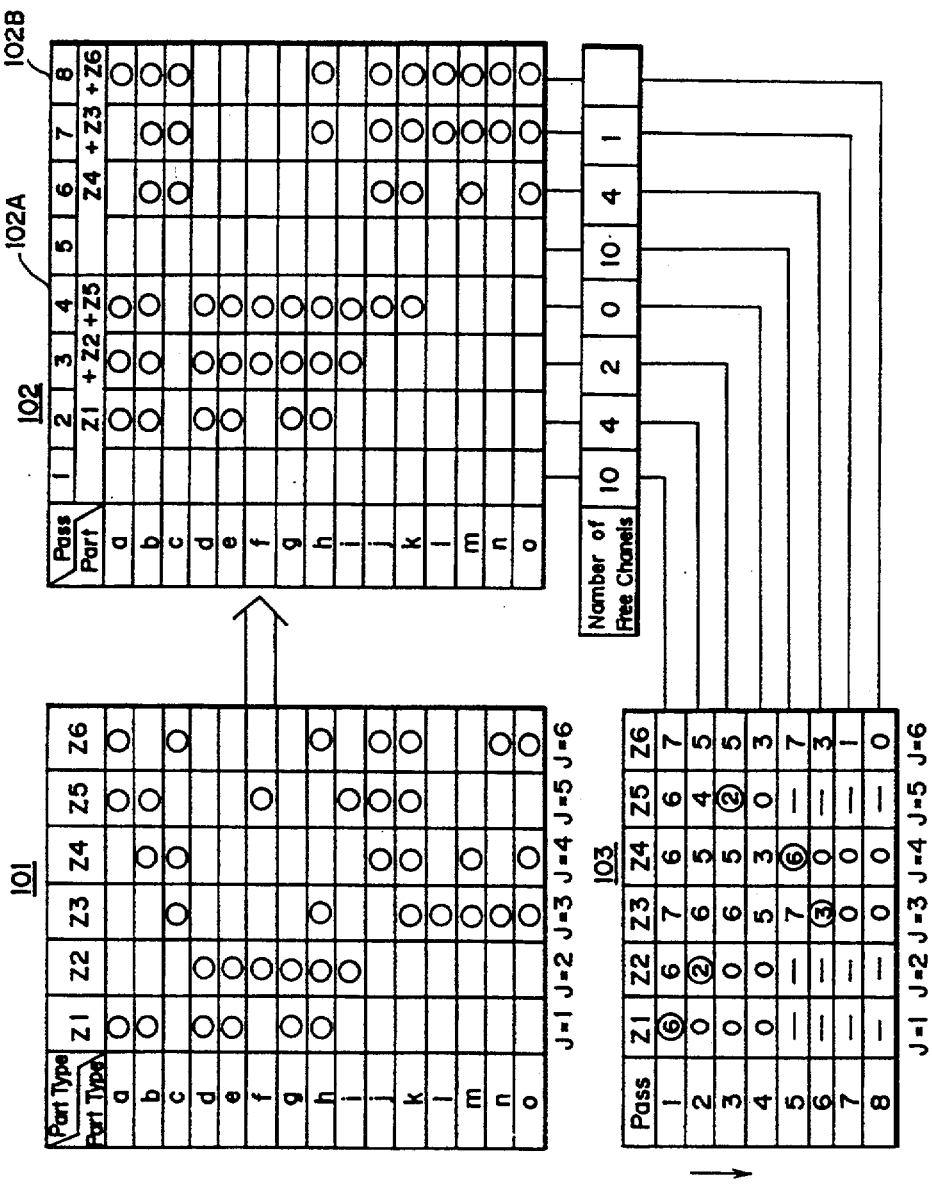
FIG. 13 is a view describing the flow of the data tables in FIG. 12 as they are being created.

FIG. 13 describes the flow of the tables in FIG. 12 as they are being created. The table 101 contains the required number of product types Z1 through Z6 (in this example) and the applicability of each of all parts a through o to each of the product types Z1 through Z6, all determined based on the production order information and on the part assembly information. The table 102 in this example has two table portions 102A and 102B.

With the table 102, the table portion 102A is created first. A first write operation clears the settings in the table portion 102A. A second write operation writes the settings of parts a, b, d, e, g and h for use on the product type Z1. A third write operation writes the settings of unmatched parts f and i for use on the product type Z2. At this time, the product type Z2 has this smallest unmatched part count of 2 in connection with the second operation on the table 103. A fourth write operation writes the settings of unmatched parts j and k for use on the product type Z5. As above, the product type Z5 has this smallest unmatched part count of 2 in connection with the third operation on the table 103. In this manner, the settings of the parts a, b, d, e, f, g, h, i, j and k for use on the product types are written to the table portion 102A.

Thereafter, the table portion 102B is created likewise. The table portion 102B accommodates the settings of the parts a, b, c, h, j, k, l, m, n and o for use with the product types.

In the above example, about six or seven parts are assembled to each printed circuit board and the number of channels is 10 (see the table 92 in FIG. 11). The part and channel counts are held small here for illustrative purposes. In practice, the part and channel counts can be much larger.

Figure 14A:
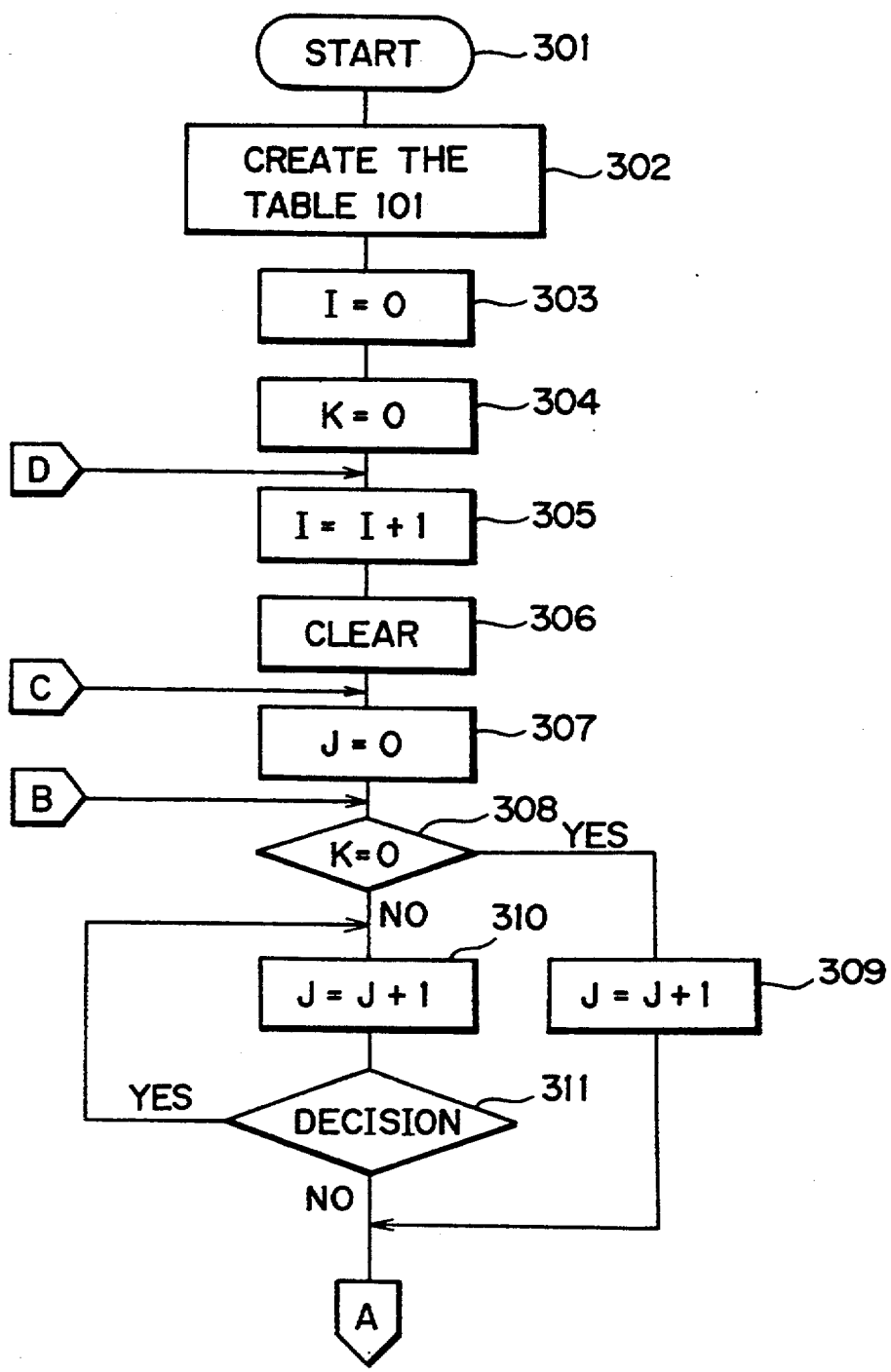
FIG. 14A is a flowchart of the steps in the first of the two parts constituting the process performed by the grouping means in FIG. 12.
Figure 14B:
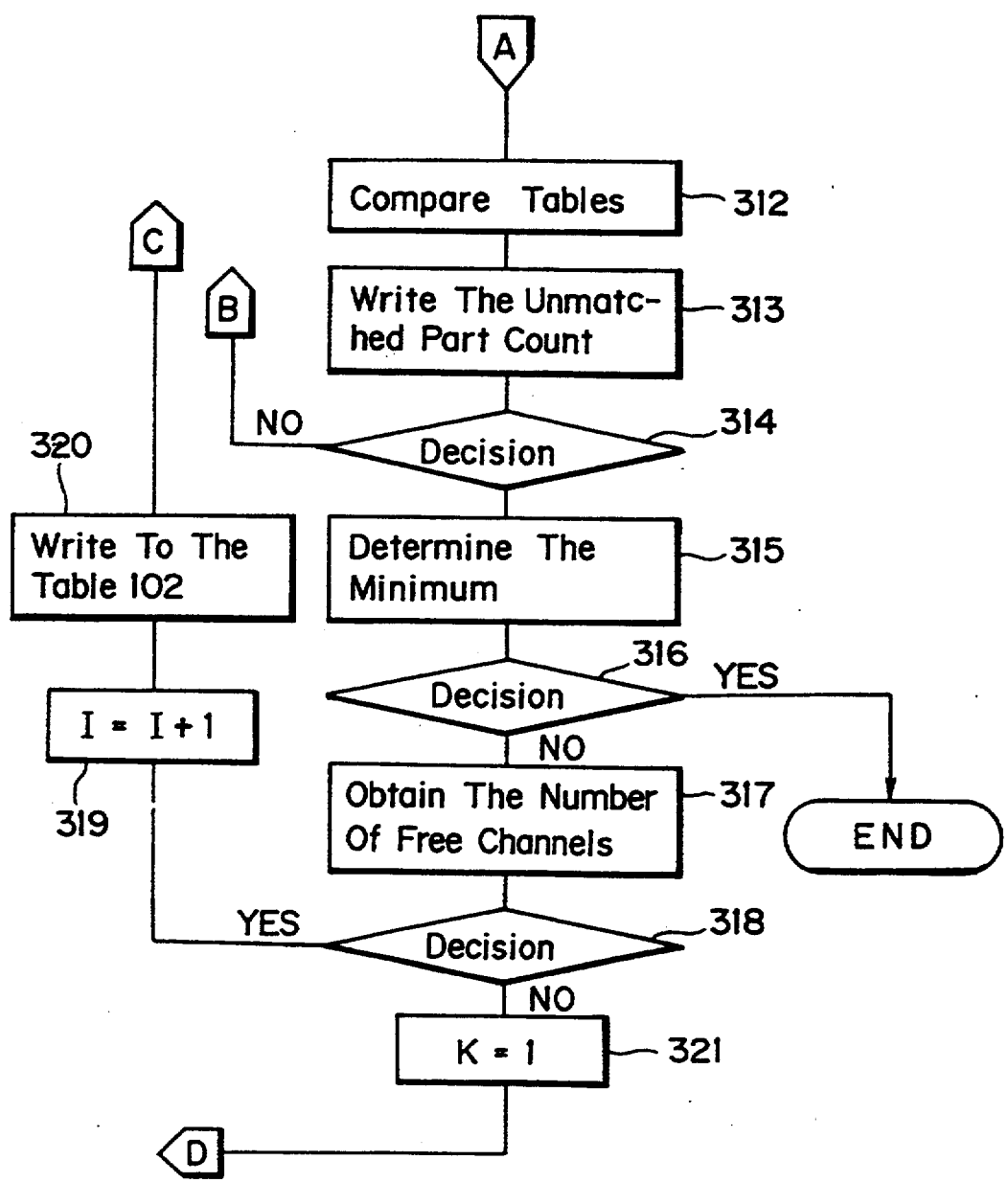
FIG. 14B is a flowchart of the steps in the second of the two parts constituting the process performed by the grouping means in FIG. 12.

FIGS. 14A and 14B are flowcharts of the grouping process carried out by the grouping means of FIG. 12. In step 301 of FIG. 14, the input of a start flag initiates the grouping process. In step 302, the table 91 (see FIG. 11) is selected for the product types Z1 through Z6 designated by production order information, and the table 101 is created from the table 91. That is, the parts a, b, d, e, g and h are set for use on the product type Z1; the parts d, e, f, g, h and i are set for use on the product type Z2; the parts c, h, k, l, m, n and o are set for use on the product type Z3; the parts b, c, j, k, m and o are set for use on the product type Z4; the parts a, b, f, i, j and k are set for use on the product type Z5; and the parts a, c, h, j, k, n and o are set for use on the product type Z6.

In steps 303, an operation pass variable I is cleared to zero. In step 304, an operation pass flag K is cleared to zero. In step 305, the variable I is set to 1. This leads to step 306 which clears the settings of pass 1 in the table portion 102A of the table 102.

In step 307, a control variable J indicating the product type is cleared to zero. In step 308, a check is made to see if the flag K is zero. Because the flag K is initially zero, control skips over steps 310 (J=J+1) and 311 (which checks if table 102 already has a product type set thereto) and goes instead to step 309 (J=J+1) followed by step 312.

Step 312 compares the contents of the table 102 with the product type J (=1; Z1) in the table 102. In this case, the settings of pass 1 in the table portion 102A of the table 102 are cleared. Thus in step 313, the part count of 6 for the product type Z1 is written as the unmatched part count to the location of pass 1, J=1, in the table 103. In step 314, a check is made to see if all operations are completed on the product type J (=1−6). Because J=1 in this instance, step 309 is reached again via step 308. Step 309 is followed by step 312 that performs a compare operation on the next product type (J=2). At this time, the unmatched part count is written to the location of pass 1, J=2, in the unmatched part count table 103.

These operations are repeated as J is set successively to 2 through 6. When J=6, the unmatched part count operations are completed on all product types. Then step 314 is followed by step 315 in which the minimum unmatched part count is determined when the pass is 1 and J=1−6. Because the minimum unmatched part count is 6 for this pass of operations, that count initially set when J=1 is output as the minimum unmatched part count.

In step 316, a check is made to see if the unmatched part count is zero for all product types (J=1−6). This check is done so as to verify if all part channel settings have been made. Since the unmatched part count for all product types is not zero this time, step 316 is followed by step 317.

In step 317, the number of free channels is obtained. Because the part type count available for setting to channels is set to 10 in this case, the number of free channels is 10. In step 318, the difference between the number of free channels and the number of used channels is acquired.

Because all channels are found to be cleared this time, the number of free channels at this stage is 10. With the number of free channels (which is 10) greater than the unmatched part count (which is 6), channel setting is deemed to be available and step 319 is reached. In step 319, the variable I is incremented by 1 (I=I+ 1). Step 320 reads the parts a, b, d, e, g and h corresponding to the product type J (=1) and writes them to the location of pass I (2) in the table portion 102A of the table 102.

Step 320 is followed by step 307 where the operations for the next pass 2 start. With J reset to 0, step 307 is followed by step 308 that leads to step 309. In step 309, J is set to 1. In step 312, a comparison is made between the table portion 102A of the table 102 on the one hand, and the parts for use with the product type Z1 in effect when Z=1 in the table 101 on the other. Because in this case the parts set in the table portion 102A of the table 102 are for use with the product type Z1, the unmatched part count is 0. In step 313, an unmatched part count of 0 is written to the location of the current pass in effect when J=1 in the table 103.

Step 313 is followed by step 314 which then leads to step 308. Step 308 is followed by step 309 in which J is updated to 2. In step 312, the contents of the table portion 102A in the table 102 are compared with the parts d, e, f, g, h and i for use with the product type Z2 (applicable when J=2 in table 101). In this case, the table portion 102A of the table 102 is at pass 2. Thus the unmatched parts are parts f and i, and the unmatched part count is 2. In step 313, the unmatched part count of 2 is written to the location of pass 2, J=2. Step 313 is followed by steps 314, 308 and 309, in that order.

These operations are repeated as J is set successively to 3 through 6. The results are written to the locations of pass 2, J=3−6 in the table 103. If step 314 finds that all product types (J=1−6) have been checked, step 315 is reached. Step 315 acquires the product type for which the unmatched part count is the smallest and other than zero at pass 2 in the table 103. In this case, the unmatched part count 2 (J=2) applies and is output as a result. Step 316 finds that the unmatched part counts are not all zero for the product types J (=1−6). Thus step 317 is reached in which free channels are obtained. Step 317 is followed by step 318.

Step 318 compares the number of free channels with the unmatched part count. In this case, the number of free channels, which is 4, is larger than the unmatched part count, which is 2. Step 318 is therefore followed by step 319 in which I is set to 3. In step 320, the parts d, e, f, g, h and i for use on the product type Z2 (J=2) are written to the location of pass 3 in the table portion 102A of the table 102. Because the parts d, e, g and h are already written in the table, the parts f and g are newly added thereto.

The same operations are carried out for pass 3. Accordingly the parts a, b, f, i, j and k for use on the product type Z5 (J=5) corresponding to the minimum unmatched part count of 2 are written to the location of pass 3 in the table portion 102A of the table 102. Because the parts a, b, f and i are already written in the table, the parts j and k are newly added thereto. The result of the write operations is as shown in FIG. 13, at pass 4 in the table portion 102A of the table 102. A total of 10 parts are thus written to the table.

The same operations are carried out for pass 4. For this pass, the number of free channels is 0. This means that in step 318, the free channel count is found to be smaller than the unmatched part count. Thus step 318 is followed by step 321 in which the flag K is set to 1; no parts are written to the table portion 102A of the table 102. Step 321 is followed by step 305 in which is performed the operation of I=I+1. When I=5, the table portion 102B of the table 102 starts to be created. Using the same operations as before, the unmatched part count is calculated for pass 5 as J is set consecutively to 1 through 6. The processing of the product types Z1, Z2 and Z5 is completed by the time the table portion 102A of the table 102 is finished. Thus steps 308, 310 and 311 are carried out, in that order, with the result that the current and subsequent passes address the product types when J=3, 4 and 6. That is, in step 313, unmatched part counts 7, 6 and 7 are acquired when J=3, 4 and 6, respectively, for pass 5. In step 320, the part types b, c, j, k, m and o for use on the product type Z4 having the unmatched part count of 6 are written to the table. The table portion 102B of the table 102 results in the status at pass 6 in FIG. 13. In step 313, unmatched part counts 3, 0 and 3 are computed when J=3, 4 and 6, respectively, for pass 6. "J=3" corresponding to the smallest and other-than-zero unmatched part count of 3 is output. Step 320 writes to the table the part types c, h, k, l, m, n and o for use on the product type Z3 corresponding to "J=3" having the unmatched part count of 3. The table portion 102B of the table 102 results in the status at pass 7 in FIG. 13. In step 313, for pass 7, unmatched part counts of 0, 0 and 1 are calculated when J=3, 4 and 6, respectively. "J=6" corresponding to the smallest and other-than-zero unmatched part count of 1 is output. Step 320 writes to the table the part types a, c, h, j, k, n and o for use on the product type Z6 in effect when J=6. The table portion 102B of the table 102 results in the status at pass 8 in FIG. 13. For pass 8, in step 313, unmatched part counts of 0, 0, 0 are computed when J=3, 4, 6, respectively. Because the unmatched part count is zero for all product types (J=3, 4 and 6), a "YES" decision is made in step 316, which brings the process to an end.

As described, the above embodiment arranges printed circuit boards into groups each of which accepts parts for assembly thereto from the same pallet group. The grouping makes it possible to assemble in a chronologically random manner the printed circuit board units that use common parts. This minimizes the number of preparatory steps for switching part-bearing pallets on the part assembler while the machine is shut down. Because each contemplated grouping is verified before implementation for its feasibility through the use of a special matrix arrangement, the amount of grouping calculations is drastically reduced and the arranging of pallets is quickly carried out. When channel setting data are created based on such groupings, the pallets making up each pallet group are made to consume as equal times as possible regarding the printed circuit boards involved. This minimizes time losses on the part assembler so that the machine will work more efficiently than ever before.

As described, the invention provides a pallet arranging system that minimizes the number of preparatory steps to take in a multiple-item small-lot production setup, whereby the availability of the part assembler is raised significantly.

Where channel setting data are being created for use with the part assembler, a plurality of cartridges may be available for mounting onto any one channel. In that case, the channel setting data are created in such a manner that one of the multiple cartridges is selected for mounting onto that channel. This means that if the parts held in one cartridge are not all consumed, that cartridge retains an inventory of parts. With an increasing number of such cartridges accumulated, the inventory of parts will grow.

It is in consideration of the above aspect that the following embodiment of the invention is proposed. This alternative embodiment is a pallet arranging system suitable for reducing the inventory of parts.

Figure 15:
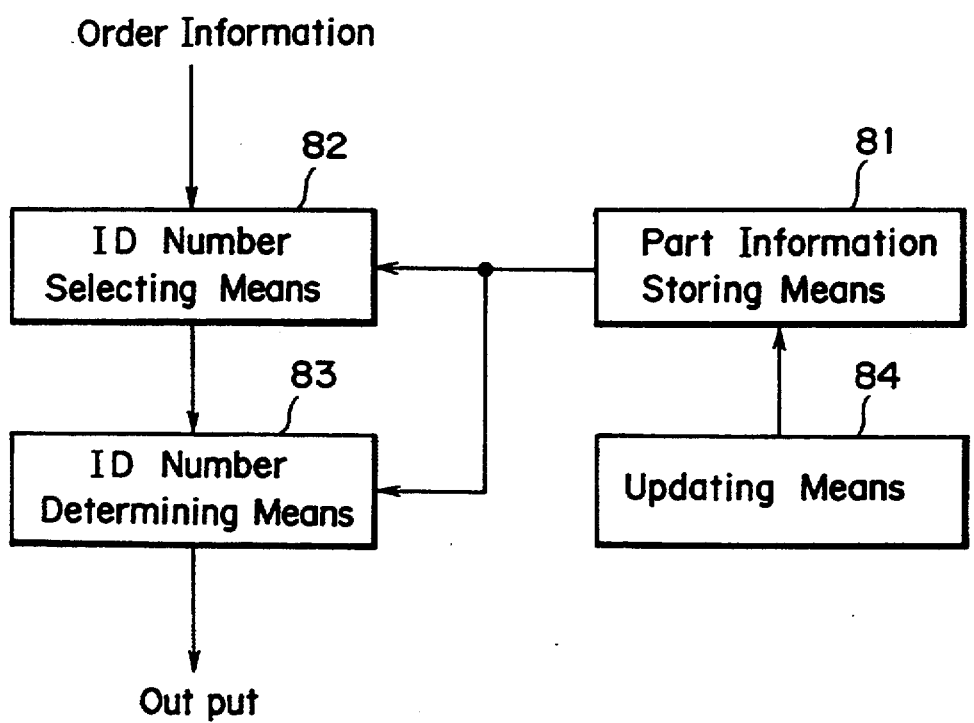
FIG. 15 is a block diagram depicting how an inventory of parts is reduced illustratively by use of another embodiment of the invention.

FIG. 15 is a conceptual block diagram depicting how an inventory of parts is reduced illustratively by use of the embodiment. In FIG. 15, part information storing means 81 stores the ID numbers specific to the reels received and the part information about the types and quantities of parts held on the reels. ID number selecting means 82 compares the order information about the types and quantities of parts to be assembled by the part assembler with the contents of the part information storing means 81. In doing so, the ID number selecting means 82 acquires the ID number of the reel that meets two conditions: (a) the part type derived from the order information is to match the part type stored in the part information storing means 81; and (b) the part quantity derived from the order information is to be smaller than the part quantity held in the part information storing means 81. If there exist a plurality of reels defined by the ID number selected by the ID number selecting means 82, ID number determining means 83 outputs the ID number of the reel whose part quantity is the smallest. If there is only one reel defined by the ID number selected by the ID number selecting means 82, that selected ID number is output as is. Updating means 84 updates the stored information in the part information storing means 81 about the part quantities in accordance with the quantities of parts consumed by the part assembler.

The embodiment constituted by the above components causes the part assembler to be fed preferentially with those reels which have been used at least once and of which the part counts are reduced. This lowers the inventory of the parts held on the reels. Below is a more specific description of what the embodiment does.

Figure 16:
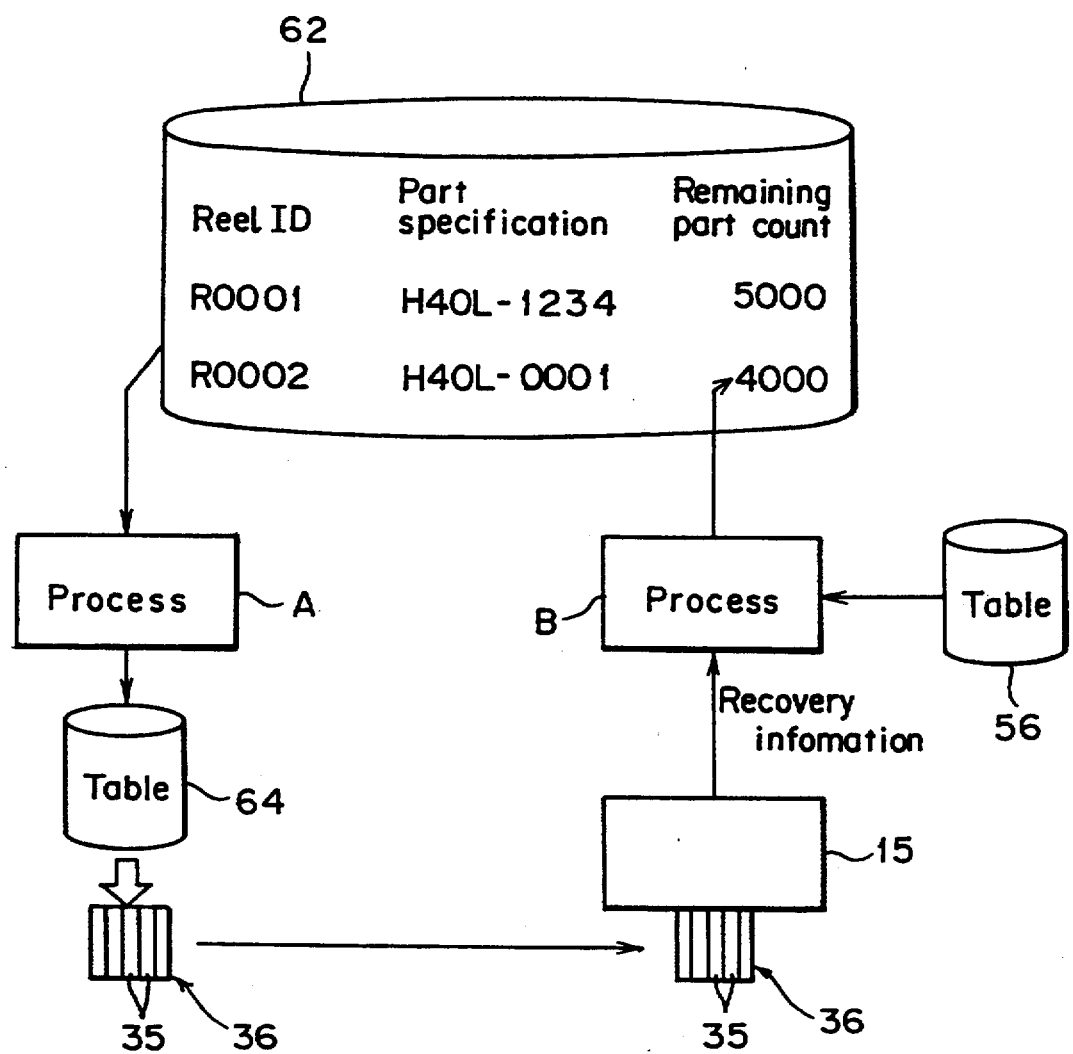
FIG. 16 is a view outlining how the process of FIG. 15 is carried out.

FIG. 16 is a view outlining how step 216 in FIG. 7B is carried out by the embodiment of FIG. 15. The reel control table 62 stores the ID number, part specification and remaining part count specific to each of the reels used. The table 62 is created by writing thereto the ID numbers of parts as they are received, and is updated as needed. Referring to FIG. 16, process A creates channel setting data. The data are stored into the pallet control table 64. Based on the data in the table 64, the automatic arranging machine 12 (see FIG. 2) arranges pallets. That is, cartridges 35 are mounted where appropriate onto each pallet 36. The cartridge-bearing pallets 36 are fed to the small part assembler 15. The small part assembler 15 is also supplied separately with printed circuit boards. The parts are then assembled by the small part assembler 15 onto the printed circuit boards.

In some cases, the small part assembler 15 attempts to assemble parts but fails to do so successfully. Such parts are damaged by the attempt and must be discarded. In such cases, a retry operation is performed on the same part type. It used to be the case that all information conveyed to the small part assembler about such assembly failures is how many times the retry operation is carried out on which channel. By contrast, this embodiment includes process B in which occurs the following: Recovery information from the small part assembler 15 (i.e., information about how many times the retry operation is performed on which channel) and the NC data stored in the source data table 56 (i.e., data for matching channel numbers with part specifications) are used to calculate the number of parts actually consumed by the small part assembler 15. The result is used to update the contents of the reel control table 62 regarding part quantities. When the process A creates channel setting data, there may exist a plurality of ID numbers for the same part specification. In that case, the ID number for which the remaining part count is the smallest is selected, and the reel designated by that ID number is employed. This prevents the occurrence of many reels with partially scattered parts left thereon. Thus the inventory of parts is reduced significantly.

Suppose that expensive IC parts are fed in units of certain quantities per production order. In that case, applying the process of FIG. 16 with no change may reduce the efficiency of pallet arrangement in conjunction with the part assembler that performs retry operations. For example, one reel mounted with expensive parts may need to be supplemented by at least one more reel with parts of the same type mounted thereon. This costly redundancy is circumvented by taking the following measures: The part specification table 53 (see FIG. 6) is made to contain a flag for determining if the part in question is an expensive or otherwise special one for the current order. Furthermore, the reel control table 62 (see FIG. 6) is supplemented with a column for storing order information. The information thus added is used to arrange pallets.

While preferred embodiments of the invention have been described using specific terms, such description is for illustrative purposes only, and it is to be understood that changes and variations may be made without departing from the spirit or scope of the following claims.

What is claimed is:

1. A pallet arranging system for assigning a plurality of cartridges to a plurality of pallet groups and arranging the pallet groups to efficiently assemble a plurality of printed circuit boards the plurality of printed circuit boards being used to produce a variety of different products, each of said plurality of pallet groups including a plurality of pallets, each pallet having a plurality of channels and each of said plurality of cartridges containing a number of a respective one of a plurality of part types, said system comprising:

a first table for storing production order information regarding a product to be produced on each respective one of said plurality of printed circuit boards;

a second table for storing part assembly information relating to each of said plurality of part types to be assembled on respective ones of each of said plurality of printed circuit boards;

grouping means comprising:

means for obtaining part types from said plurality of part types contained in said plurality of cartridges for assembly on each of said plurality of printed circuit boards and grouping the part types into the plurality of pallet groups based on said production order information and part assembly information; and means for grouping said plurality of printed circuit boards based on the pallet groups formed by said means for obtaining; and means for creating channel setting data for assigning each of said plurality of cartridges to a respective one of said plurality of channels within each pallet based upon the pallet groups formed by the means for obtaining, wherein the groups of printed circuit boards and said plurality of pallet groups are prepared for sending to a part assembler for assembling the plurality of part types on the plurality of printed circuit boards and wherein the assigning of said plurality of cartridges to their respective pallets based on the production order information and part assembly information minimizes an amount of times said pallet groups are changed on the part assembler with respect to the types of said plurality of part types contained in the cartridges assigned to the pallet groups and defines a maximum allowable number of said plurality of channels of each of said plurality of pallets.

2. The pallet arranging system according to claim 1, wherein said grouping means further comprises:
a third table for storing information regarding part types for assembly on each of said plurality of printed circuit boards;
a fourth table for consecutively and individually storing part information in accordance with the information stored in said third table;
means for comparing the information stored in the third table with the part information stored in the fourth table and generating a count of unmatched parts for each of said plurality of part types;
a fifth table for consecutively storing the count of unmatched parts for each of said plurality of part types in accordance with said groups of printed circuit boards; and
means for selecting the count of unmatched parts having the smallest value from the fifth table.

3. The pallet arranging system according to claim 1, further comprising:
means for checking the groups of said plurality of circuit boards for conduciveness prior to grouping by said means for grouping; and
means for feeding one of said plurality of pallets to said part assembler and positioning an adjacent pallet into a standby position in a predetermined time period thereby timing the feeding of pallets to the part assembler to eliminate any delay period in feeding of the adjacent pallet to the part assembler upon completion of operation of the part assembler on a previous pallet.

4. The pallet arranging system according to claim 3, wherein said means for checking includes:
means for creating a matrix containing, as parameters, a number equal to said plurality of channels and a number of parts in each pallet for assembling on a printed circuit board, said parameters being used for determining both a maximum and a minimum number of pallets needed to minimize time loss between feeding of adjacent pallets to the part assembler; and
means for comparing said maximum and minimum number of pallets for each group of printed circuit boards.

5. The pallet arranging system according to claim 3, wherein said means for creating channel data includes:
means for determining an amount of time each pallet will consume during assembling of each group of printed circuit boards when fed into the part assembler; and
means for arranging the cartridges in said plurality of pallets in order for each pallet to consume substantially equal periods of time.

6. The pallet arranging system according to claim 1, wherein each of said plurality of cartridges includes:
a reel for holding a bandshaped case to the cartridge, wherein each bandshaped case contains parts of the same type and upon the generating of said channel setting data each reel is assigned to a respective channel based on the number of parts contained in the bandshaped case.

7. The pallet arranging system according to claim 6, further comprising:
information storing means for storing an identification number identifying each individual reel and information relating to an amount and type of a part held by each individual reel;
identification number selecting means for comparing the information stored in said information storing means with information relating to each type of the plurality of part types and a total number of each type of said plurality of part types to be assembled by said part assembler, and selecting identification numbers identifying at least one of the reels based upon the comparison and a determination that the total number of a respective part type of said plurality of part types has a value less than the number of parts held by the reel;
identification number determining means for outputting the identification number of the reel selected by the selecting means upon selecting one reel and determining the reel of the at least one reel having a smallest total number of a respective part and outputting the identification number of the reel having the smallest total number upon selecting more than one reel by the selecting means; and
means for updating the information stored in the information storing means in accordance with information indicative of consumption of said plurality of part types during assembly of said plurality of printed circuit boards.

8. The pallet arranging system according to claim 7, further comprising means for producing a count of a number of times the part assembler attempts to assemble a part for each of said plurality of part types and means for calculating a number of parts consumed during assembly based upon said production order information and the count produced by the means for producing.

* * * * *